(12) United States Patent
Joo et al.

(10) Patent No.: US 6,762,091 B2
(45) Date of Patent: Jul. 13, 2004

(54) METHODS FOR MANUFACTURING SEMICONDUCTOR DEVICES HAVING A METAL LAYER

(75) Inventors: Jae-hyun Joo, Seoul (KR); Wan-don Kim, Kyungki-do (KR); Cha-young Yoo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 73 days.

(21) Appl. No.: 10/013,577

(22) Filed: Dec. 11, 2001

(65) Prior Publication Data

US 2002/0146881 A1 Oct. 10, 2002

(30) Foreign Application Priority Data

Apr. 10, 2001 (KR) ......................................... 2001-18960

(51) Int. Cl.[7] .............................................. H01L 21/00
(52) U.S. Cl. .................... 438/253; 438/240; 438/210
(58) Field of Search ................................ 438/253, 240, 438/210, 254, 255, 256, 211, 241, 242, 243, 257, 258, 381, 239, 640, 673, 978, 250, 244, 251, 252, 393–398; 257/306, 768–9

(56) References Cited

U.S. PATENT DOCUMENTS

| | | | |
|---|---|---|---|
| 6,180,974 B1 * | 1/2001 | Okutoh et al. .............. 257/306 |
| 6,313,539 B1 * | 11/2001 | Yokoyama et al. ......... 257/761 |
| 6,320,244 B1 * | 11/2001 | Alers et al. .................. 257/534 |
| 6,326,218 B1 * | 12/2001 | Yunogami et al. .............. 438/3 |
| 6,329,234 B1 * | 12/2001 | Ma et al. ..................... 438/210 |
| 6,333,224 B1 * | 12/2001 | Lee ............................. 438/243 |
| 6,338,999 B1 * | 1/2002 | Hsue et al. .................. 438/253 |
| 6,451,665 B1 * | 9/2002 | Yunogami et al. .......... 438/397 |
| 6,596,581 B2 * | 7/2003 | Park et al. ................... 438/253 |
| 2002/0146881 A1 * | 10/2002 | Joo et al. ..................... 438/240 |

FOREIGN PATENT DOCUMENTS

| | | |
|---|---|---|
| JP | 2000-208440 | 7/2000 |
| JP | 2001036027 | 2/2001 |
| KR | 2000-0044608 | 7/2000 |

OTHER PUBLICATIONS

Translation of Notice to Submit Response from Korean Patent Office for Korean Application No. 10–2001–0018960 dated Feb. 28, 2003.

* cited by examiner

*Primary Examiner*—Carl Whitehead, Jr.
*Assistant Examiner*—Laura M Schillinger
(74) *Attorney, Agent, or Firm*—Myers Bigel Sibley & Sajovec

(57) ABSTRACT

Methods are provided for manufacturing an integrated circuit device in which a metal layer is formed on an integrated circuit substrate. A capping layer is formed on the metal layer opposite the integrated circuit substrate. The metal layer covered with the capping layer is heat-treated. The capping layer is removed and the metal layer, which is exposed by removal of the capping layer, is plasma-treated.

26 Claims, 10 Drawing Sheets

METHODS FOR MANUFACTURING SEMICONDUCTOR DEVICES HAVING A METAL LAYER

RELATED APPLICATION

This application claims priority from Korean Application No. 2001-18960, filed Apr. 10, 2001, the disclosure of which is hereby incorporated herein by reference.

BACKGROUND OF THE INVENTION

Various integrated circuit devices include an insulating layer and a conductive layer arranged on an integrated circuit substrate according to a fabrication pattern. Devices such as transistors, capacitors, interconnection layers, and plugs for connecting to interconnection layers, may be formed in this manner. For certain structures, an additional device may be formed on an upper surface of a first, already-formed, integrated circuit device. In such a case, the electrical characteristics of the first formed device may be changed and/or degraded by the later formed device.

An example of a device subject to this problem is a capacitor, such as a metal-insulator-metal (MIM) capacitor. MIM capacitors are widely used in integrated circuit devices. As is well known to those having skill in the art, a MIM capacitor comprises spaced apart first (lower) and second (upper) metal layers (electrodes) and a dielectric layer therebetween. As the integration density of integrated circuit devices continues to increase, the area occupied by an individual device may continue to decrease. Thus, in MIM capacitors, it may be desirable to increase the capacitance by increasing the effective area of the capacitor, by forming a thin dielectric layer and/or by forming the dielectric layer of a material having high dielectric constant. Furthermore, in order to increase the effective area of a capacitor, the capacitor may be formed to have a three-dimensional structure, such as a fin structure, a cylinder structure and/or a trench structure. Unfortunately, a thin film dielectric may produce decreased reliability and high dielectric constant dielectrics may require new manufacturing processes.

The lower electrodes of a MIM capacitor may be formed of noble metals, such as platinum (Pt), ruthenium (Ru), iridium (Ir), and their oxides which generally do not react with the dielectric layer and have a high work function value. As Ru, in particular, can be easily etched by plasma containing oxygen and can form conductive oxides, Ru often may be used in forming the lower electrode of a MIM capacitor. The lower electrode of a MIM capacitor may be formed to have a three-dimensional structure, such as a cylinder structure, a pin structure and/or a trench structure.

In order to obtain a high dielectric constant from the MIM capacitor, the dielectric layer may be crystallized, for example, by annealing at a temperature above the crystallization temperature, after forming the dielectric layer, and/or the MIM capacitor may be cured by heat-treating the MIM capacitor after forming the upper electrode. In order to reduce defects occurring during processes for forming a capacitor, after forming the capacitor, curing may be performed at a temperature lower than a crystallization temperature, that is, at about 400° C., in an oxygen atmosphere. However, the dielectric layer may crack due to heat treatment. Thus, there may be limitations in the heat treatment, and the characteristics of a capacitor may be degraded due to the heat treatment.

Various problems associated with MIM capacitors will now be described further with reference to FIGS. 1A and 1B, FIGS. 2A and 2B, and FIGS. 3 and 4. FIGS. 1A and 1B illustrate a capacitor in which ruthenium (Ru) is used as the metal for the lower and upper electrode, and tantalum oxide ($TaO_x$) is used as a dielectric layer. FIGS. 2A and 2B illustrate the capacitor of FIGS. 1A and 1B after the dielectric layer has crystallized by annealing the lower electrode in a nitrogen ($N_x$) atmosphere at 700° C. for about 30 minutes. As shown in the figures, the lower electrode, which is formed of metals, and the dielectric layer are sequentially formed. An annealing process for crystallizing the dielectric layer is subsequently carried out. As a result, surface roughness of the metal used as the lower electrode may be increased, variations in morphology may occur, and fine cracks may be caused in the dielectric layer during cooling after annealing due to a difference in the thermal expansion coefficient of the dielectric layer and the metal used for the lower electrode. The morphology of the upper electrode and/or the lower electrode of the MIM capacitor may be changed after annealing and/or other heating processes, such as curing in a subsequent thermal treatment, because the grains of the metal for the lower electrode and/or the upper electrode may grow larger in the subsequent thermal treatment.

Further processing of the capacitor may include high-temperature heating during an intermetal dielectric (IMD) deposition or an interconnection process following formation of the upper electrode. A curing step may also be used, which may cause further variations in the upper electrode surface roughness and/or morphology. Thermal expansion coefficient differences between the upper electrode IMD, and/or interconnection materials may then cause similar problems to those discussed relative to the lower electrode. By way of example, a capacitor may be formed using Ru as the metal for a lower and upper electrode and $TaO_x$ as a dielectric layer. The capacitor may be annealed in a nitrogen atmosphere at a temperature of about 600–700° C. for about 30 minutes before subsequent processing. Such a capacitor is shown in FIG. 3, where the morphology of the upper electrode, as well as that of the lower electrode, has been changed by subsequent high-temperature heating.

As shown in FIG. 4, the leakage current in the capacitor shown in FIG. 3 may be increased by fine cracks in the dielectric layer caused by variations in the surface morphology of the upper electrode and/or the lower electrode. In addition, the adhesive strength of an insulating layer contacting an electrode may be reduced by variations in the surface morphology of the electrode. This could cause the electrode to be stripped from the insulating layer. Such a stripping or flaking problem may be found with contact plugs or interconnection layers as well as capacitors.

SUMMARY OF THE INVENTION

Embodiments of the present invention include methods for manufacturing an integrated circuit device. A metal layer is formed on an integrated circuit substrate. A capping layer is formed on the metal layer opposite the integrated circuit substrate. The metal layer covered with the capping layer is heat-treated. The capping layer is removed and the metal layer, which is exposed by removal of the capping layer, is plasma-treated.

In other embodiments of the present invention, a dielectric layer is formed on the plasma treated metal layer opposite the integrated circuit substrate. The formed dielectric layer is heat-treated, for example, to crystallize the dielectric layer. Heat-treating of the metal layer and heat-treating of the formed dielectric layer may be performed in a nitrogen atmosphere at between about 500° C. and about 800° C. or at about 700° C. As a result of the pre-heating and plasma-treating the metal layer may substantially retain its surface morphology during heat-treating of the formed dielectric layer.

In further embodiments of the present invention, the capping layer is an oxide layer. The plasma-treating of the metal layer may include exposing the metal layer to a plasma containing argon (Ar) and/or nitrogen ($N_2$). The integrated circuit device may be an integrated circuit capacitor and the metal layer may be an electrode of the capacitor and the dielectric layer may be a dielectric layer of the capacitor.

In other embodiments of the present invention, the metal layer is formed from at least one of ruthenium (Ru), iridium (Ir), platinum (Pt), rhodium (Rh), palladium (Pd), and metal oxides of Ru, Ir, Pt, Rh, and Pd. The dielectric layer may be an oxide layer formed of tantalum (Ta), titanium (Ti), and/or aluminum (Al). In yet other embodiments, the dielectric layer may be formed of at least one of $SrTiO_3$ (STO), (Ba, Sr)$TiO_3$ (BST), $PbTiO_3$, Pb(Zr, Ti)$O_3$ (PZT), $SrBi_2Ta_2O_5$ (SPT), (Pb, La)(Zr, Ti)$O_3$, $Bi_4Ti_3O_{12}$, and $BaTiO_3$ (BTO).

In further embodiments of the present invention, methods are provided for manufacturing an integrated circuit device including forming a metal layer on an integrated circuit substrate. A capping layer is formed on the metal layer opposite the integrated circuit substrate. The metal layer, covered with the capping layer, is heat-treated. The capping layer is removed and a dielectric layer is formed on the heat-treated metal layer opposite the integrated circuit substrate. The formed dielectric layer is heat-treated, for example, to crystallize the dielectric layer.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE INVENTION

Figure 1A:
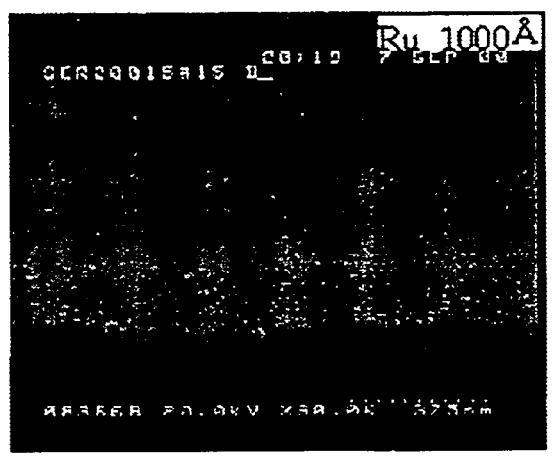
FIGS. 1A, 1B, 2A, and 2B are transmission electron microscope (TEM) photos illustrating variations in the morphology of a lower electrode of a capacitor caused by thermal treatment.
Figure 1B:
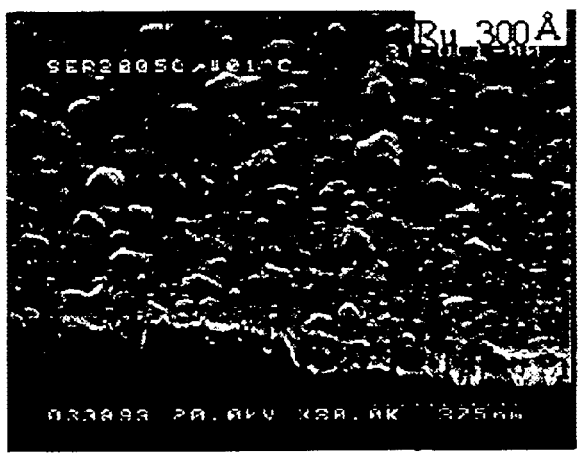
Figure 2A:
Figure 2B:
Figure 3:
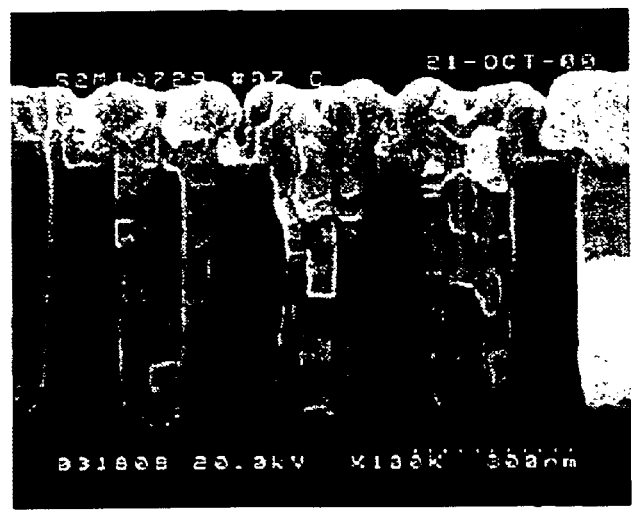
FIG. 3 is a scanning electronic microscope (SEM) photo illustrating variations in the morphology of a conventional capacitor.
Figure 4:
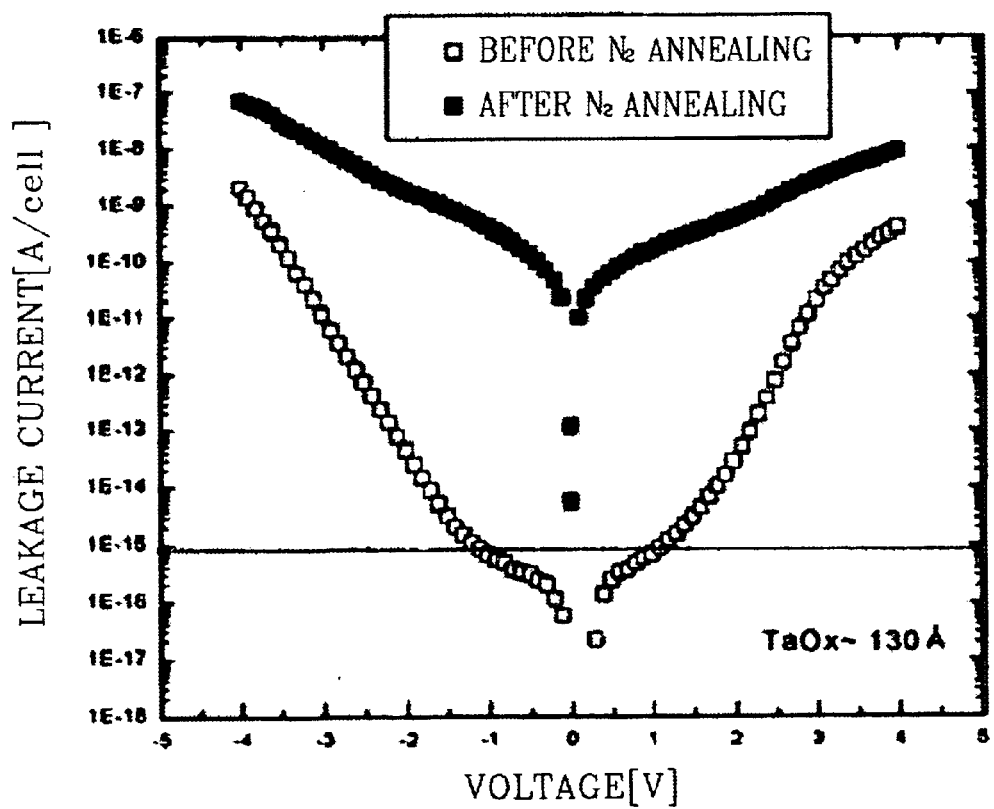
FIG. 4 is a graph illustrating leakage current of a capacitor before and after annealing.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 5A:
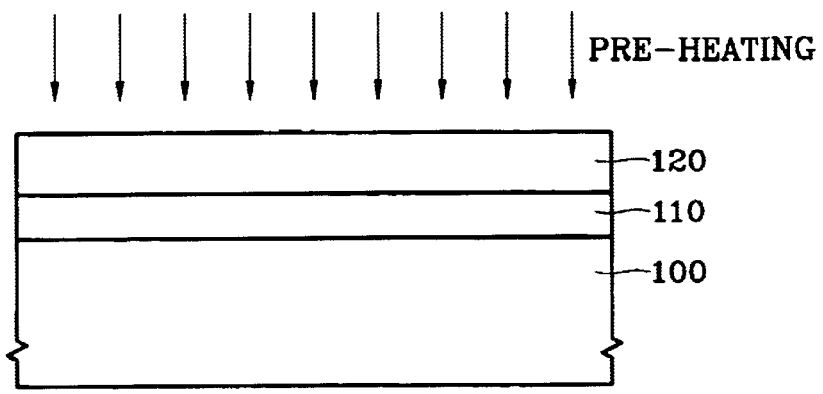
FIGS. 5A through 5C are schematic sectional views illustrating methods for manufacturing an integrated circuit device according to embodiments of the present invention.

Methods for manufacturing an integrated circuit in accordance with embodiments of the present invention will now be described with reference to the schematic sectional views illustrated in FIGS. 5A–5C. Referring first to FIG. 5A, a metal layer 110 and a capping layer 120, which maybe an oxide layer, are illustrated. These layers 110, 120 are sequentially formed on an integrated circuit substrate 100, such as a semiconductor substrate. For example, for high integration devices, the metal layer 110 and the capping layer 120 may be formed using a chemical vapor deposition (CVD) process. As further illustrated in FIG. 5A, the metal layer 110, covered with the capping layer 120, is heat treated in a pre-heating operation. The pre-heating may be performed in a nitrogen atmosphere, such as an $N_2$ atmosphere. More particularly, the pre-heating may be at a temperature substantially corresponding to a temperature to be used during a subsequent heating operation. For example, the pre-heating temperature may correspond to the temperature to be used to crystallize a dielectric layer in a subsequent step in fabrication of a capacitor. Such a temperature may be from about 500° C. to about 300° C., or from about 600° C. to about 700° C. or about 700° C. in various embodiments of the present invention. At such temperatures during pre-heating, grains may be grown in the metal layer 110.

Figure 5B:
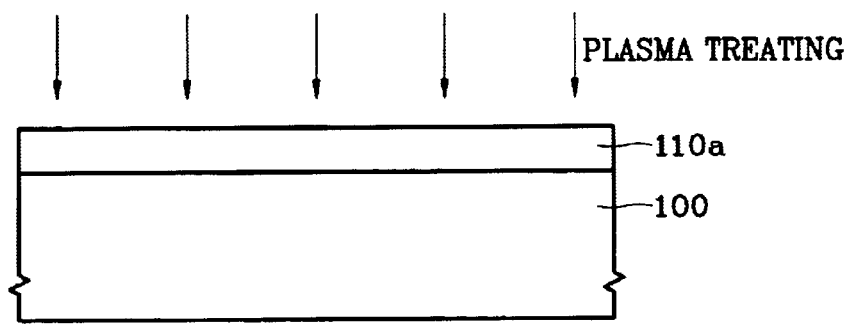

Referring now to FIG. 5B, the metal layer 110, after pre-heating, is identified by reference numeral 110a. As shown in FIG. 5B, the capping layer 120 is removed after pre-heating to expose the metal layer 110a and the exposed metal layer 110a is plasma-treated. Plasma-treating maybe performed by charged particles which are accelerated so that the particles bombard the metal layer 110a. The resulting damage to the surface of the metal layer 110a may, thereby suppress variations in the surface morphology of the metal layer 110a resulting from grain growth. The metal layer 110a, in various embodiments of the present invention is exposed to a plasma including nitrogen (N/$N_2$) and/or argon (Ar). The plasma-treating operation may be calibrated to provide accelerated particles having an electric charge selected within a range to avoid etching away of the metal layer 110a by way of sputtering when the particles bombard the metal layer 110a.

Figure 5C:
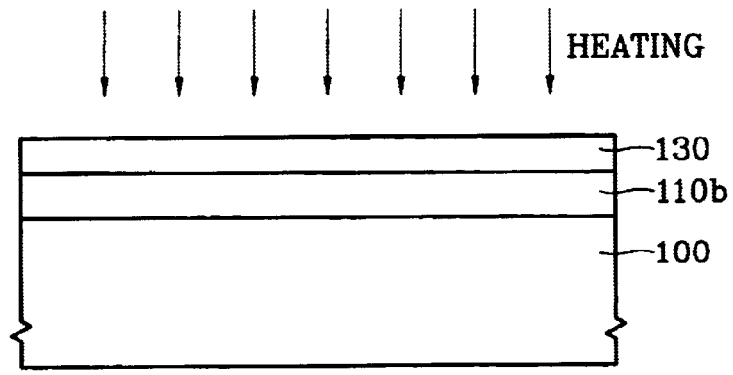

Referring now to FIG. 5C, the metal layer 110, after plasma-treating, is identified by reference numeral 110b. After the capping layer 120 is removed and the metal layer 110 is plasma treated, as shown in FIG. 5C, an insulating layer 130 is formed on top of the metal layer 110b. As shown in FIG. 5C a subsequent heating operation then occurs. More particularly, a heating (annealing) operation to improve the characteristics of the insulating layer 130 is performed. Such an annealing operation may, for example, improve the dielectric characteristics of the insulating layer 130. As discussed above, the heating operation illustrated in FIG. 5C after deposition of the insulating or dielectric layer 130 may be performed under substantially same temperature and environmental conditions as the pre-heating operation described with reference to FIG. 5A.

Figure 6A:
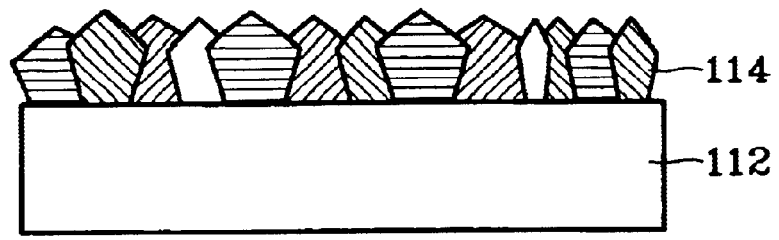
FIG. 6A is a schematic illustration of the grain of a metal layer formed according to the prior art.
Figure 6B:
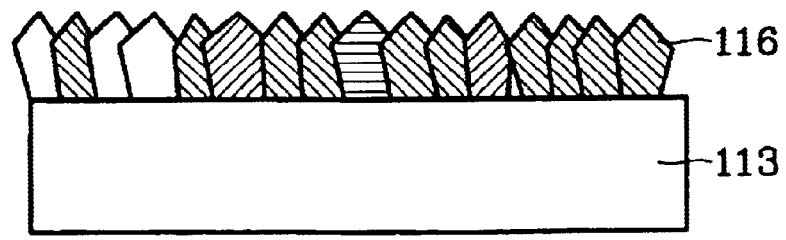
FIG. 6B is a schematic illustration of the grain of a metal layer formed according to embodiments of the present invention.

Grain formation characteristics at a surface of the metal layer 110 as fabricated according to embodiments of the present invention and by prior art processes will now be compared with reference to FIGS. 6A and 6B. As shown in FIG. 6B, if a Subsequent heating processes is performed to fabricate additional features of the integrated circuit device on a metal layer and insulating layer formed without pre-heating and plasma treating as described above, grains 114 which are non-uniform in size and overgrown in selected directions are typically formed on the top surface of the metal layer 112. In contrast, as shown in FIG. 6B, grains 116 formed on the top surface of a metal layer 113 formed according to embodiments of the present invention as described above may be more uniform in size and smaller than the grains 114 illustrated in FIG. 6A. Thus, the use of a capping layer formed on top of the metal layer, followed by a pre-heating operation and plasma-treating of the metal layer before forming of the insulating layer may reduce or prevent variations in morphology of the metal layer after fabrication of the metal layer.

Figure 7A:
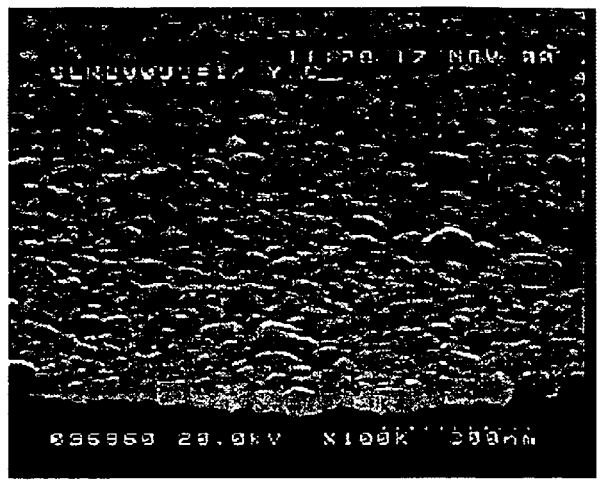
FIGS. 7A and 7B are SEM photos of integrated circuit devices manufactured according to the prior art.
Figure 7B:
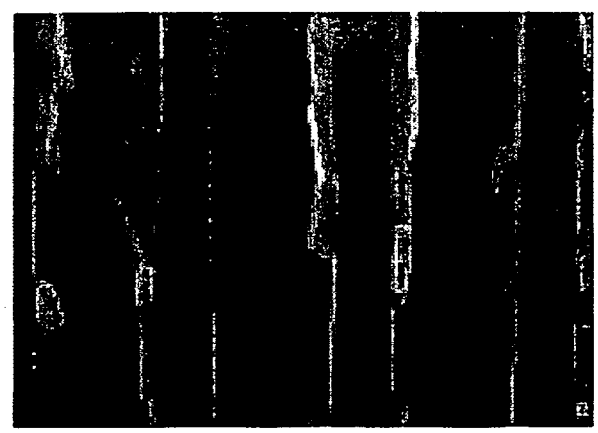

Various characteristics of integrated circuit devices manufactured in accordance with embodiments of the present invention will now be further described with reference to FIGS. 7A, 7B, and 8. FIGS. 7A and 7B are scanning electronic microscope (SEM) photos, respectively, of the surface and a sectional view of integrated circuit devices in which ruthenium (Ru) is deposited by CVD as a metal layer and heating is performed in a nitrogen (N) atmosphere at about 700° C. for 30 minutes in accordance with the prior art. As shown in FIG. 7A, the size of the grains of the metal layer in the integrated circuit device are increased by heating, thereby increasing the roughness of the surface of the Ru layer. FIG. 7B further illustrates that the shape of the features of the integrated circuit device are changed by the growth and agglomeration of the grains.

Figure 8:
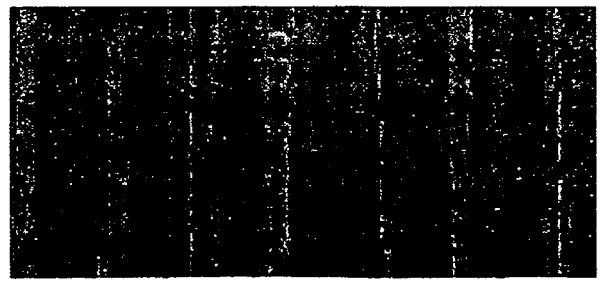
FIG. 8 is a SEM photo of an integrated circuit device manufactured according to embodiments of the present invention.

In contrast, FIG. 8 is a SEM photo of a section of an integrated circuit device formed in accordance with embodiments of the present invention in which Ru was deposited as a metal layer. An oxide capping layer was then formed on the Ru metal layer. The metal layer, covered with the capping layer, was heat-treated in a Nitrogen atmosphere at about 700° C. for 30 minutes. The capping layer was removed after the heat treating operation and the exposed metal layer was plasma-treated by exposure to an argon (Ar) plasma. The device was subsequently heated again in a Nitrogen atmosphere at about 700° C. for 30 minutes. As shown by comparison between FIG. 8 and FIG. 7B, there is a reduced variation in the surface morphology of the Ru metal layer.

While described above with reference to embodiments in which pre-heating and plasma-treating are both performed, it is to be understood that the present invention is not so limited. For example, reduced variation in surface morphology may also be provided in various embodiments of the present invention where only plasma-treating is provided or where only pre-heating is provided.

Figure 9A:
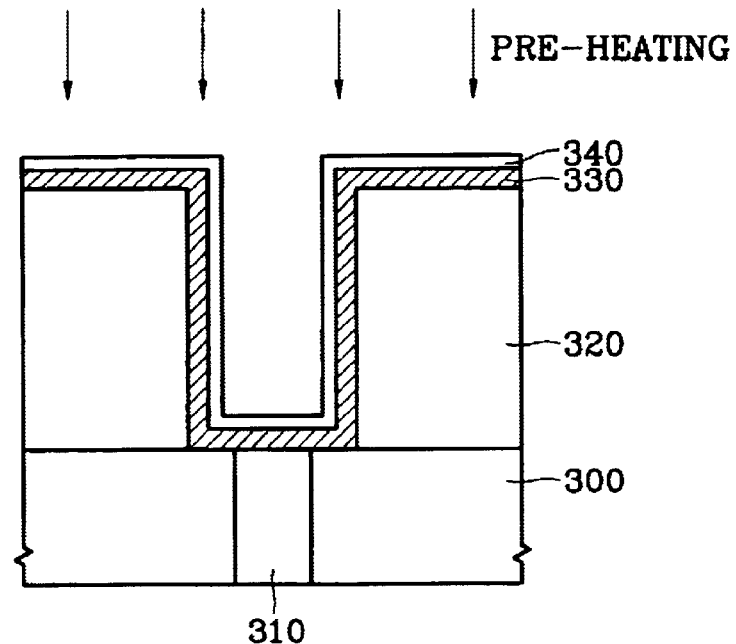
FIGS. 9A through 9F are schematic sectional views illustrating a capacitor manufactured according to embodiments of the present invention.

Operations for manufacturing an integrated circuit capacitor in accordance with embodiments of the present invention will now be described with reference to the schematic sectional views of FIGS. 9A–9F. Referring first to FIG. 9A, a lower electrode contact plug 310 is formed in a semiconductor (integrated circuit) substrate or a first interlevel dielectric (ILD) film 300. A second ILD film 320 including an opening that exposes the lower electrode contact plug 310 is formed on the semiconductor substrate or the first ILD film 300 in which the lower electrode contact plug 310 is formed A metal layer 330 defining a lower electrode of a capacitor is formed, for example, from at least one of ruthenium (Ru), iridium (Ir), platinum (Pt), rhodium (Rh), and palladium (Pd), and metal oxides of Ru, Ir, Pt, Rh, and Pd, on top of the second ILD film 320. More particularly, the metal layer 330 extends into the opening defined by the second ILD film 320.

A capping layer 340 is formed on the metal layer 330. As illustrated in FIG. 9A, the metal layer 330 covered by the capping layer 340 is heat-treated. This pre-hear may operate to grow grains of the metal layer 330, for example, by pre-heating in a nitrogen atmosphere at a temperature of about 600–700° C. The pre-heating temperature may be selected based on the temperature to be used for a subsequent heating process.

Figure 9B:
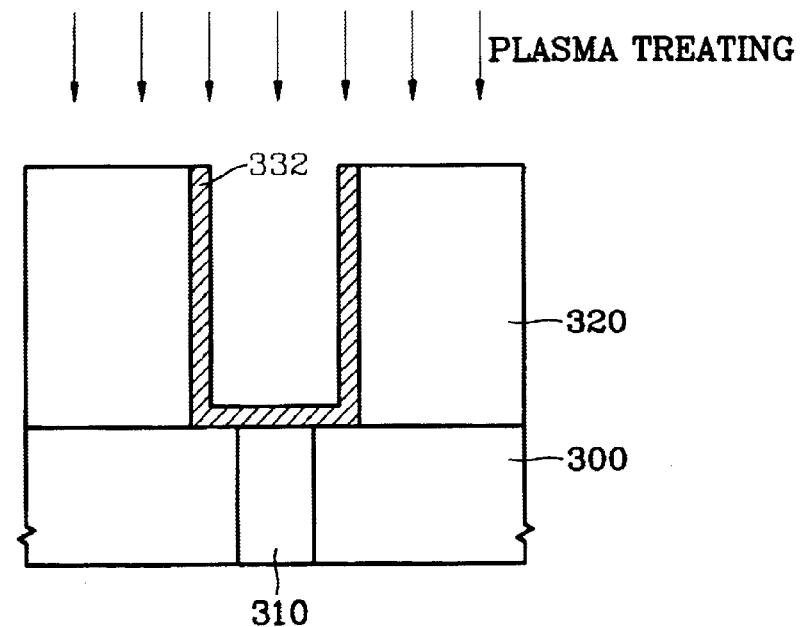

As seen in FIG. 9B, the capping layer 340 and the metal layer 330 have been node-separated, for example, by an etch-back or a chemical mechanical polishing (CMP) process, and the capping layer 340 is removed. As further illustrated in FIG. 9B, the remaining portion of the pre-heated metal layer 330, identified as metal layer 332 in FIG. 9B, is plasma-etched using a plasma including argon (Ar) and/or nitrogen (N). The plasma-etching bombards the metal layer 332 with particles in the plasma, which may thereby suppress variations in the surface morphology of the metal layer 332.

Figure 9C:
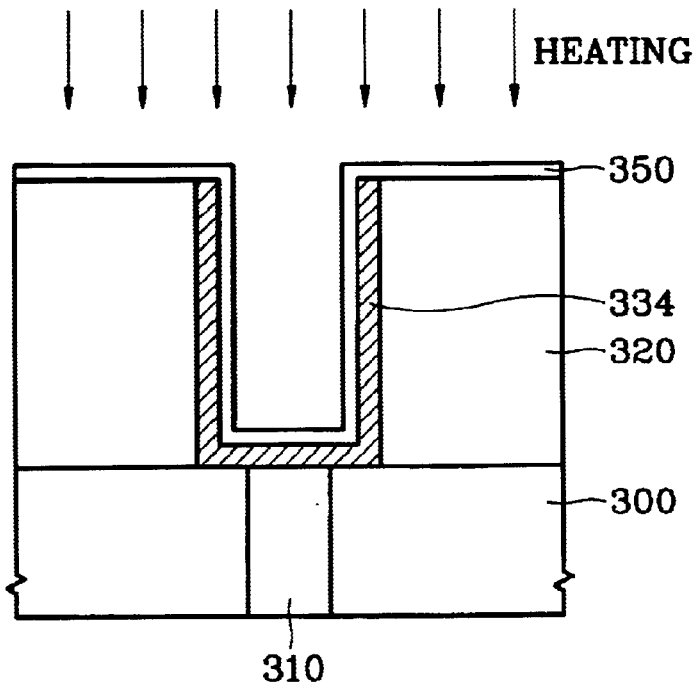

Referring now to FIG. 9C, a dielectric layer 350 is deposited on the metal layer 330, where the plasma-etched metal layer is identified as metal layer 334 in FIG. 9C. The metal layer 334 defines a lower electrode of a capacitor. Heating to crystallize the dielectric layer 350 is then performed, typically to obtain a high dielectric constant for the dielectric layer 350. The dielectric layer 350 can be an oxide layer formed of a material such as tantalum (Ta), titanium (Ti), and/or aluminum (Al), and/or can be formed of at least one of $SrTiO_3$ (STO), $(Ba, Sr)TiO_3$ (BST), $PbTiO_3$, $Pb(Zr, Ti)O_3$ (PZT), $SrBi_2Ta_2O_9$ (SBT), $(Pb, La)(Zr, Ti)O_3$, $Bi_4Ti_3O_{12}$, and $BaTiO_3$ (BTO).

Figure 9D:
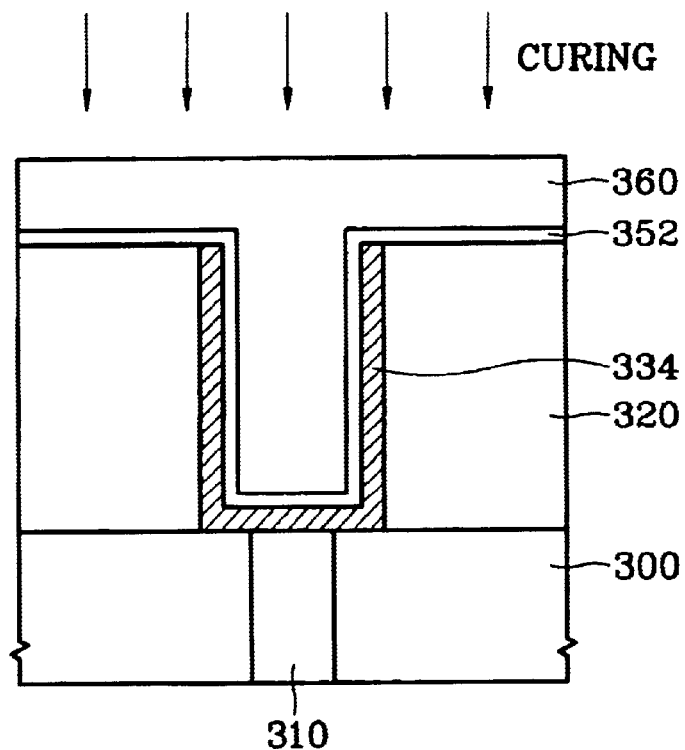

As shown in FIG. 9D, an upper electrode of the capacitor is formed by depositing a metal layer 360 on top of the dielectric layer 350, where the crystallized dielectric layer is identified as dielectric layer 352 in FIG. 9D. Curing of the integrated circuit device may then be performed in an oxygen atmosphere at a temperature of about 400° C.

Figure 9E:
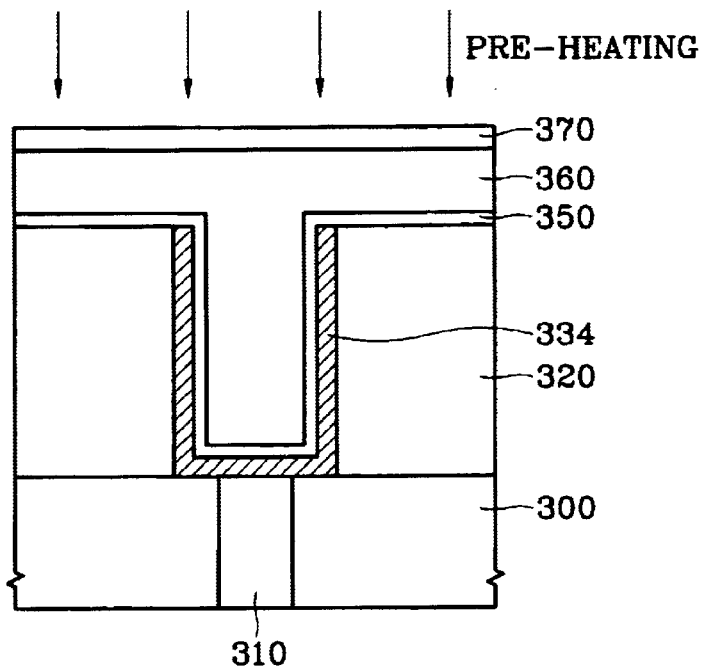
Figure 9F:
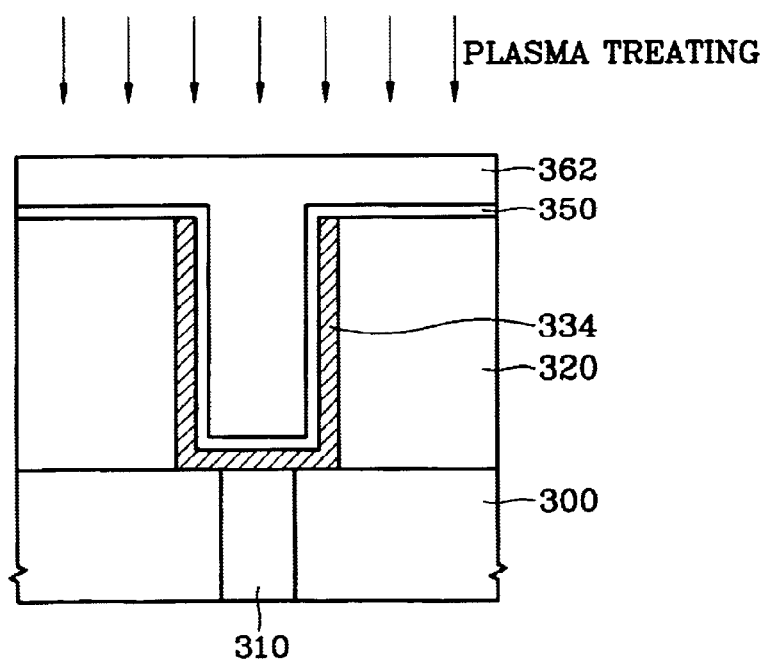

It is to be understood that a heating process, such as curing, an intermetal dielectric (IMD) deposition process, and/or an interconnection process may be performed after fabrication of the upper electrode 360 as well. This may change the surface morphology of the upper electrode in a manner similar to that described with reference to the lower electrode above. Accordingly, as illustrated in FIGS. 9E and 9F the manufacturing methods of the present invention can be utilized in forming the upper electrode prior to the operations described with reference to FIG. 9D above. In other words, as shown in FIG. 9E, a capping layer 370 formed of an oxide layer may be formed on top of the metal layer 360 defining an upper electrode, and the capped metal layer 360 may be pre-heated. The pre-heating conditions may be determined based on the thickness of the metal layer 360, the kind of metal used, and may be the same as or different from the conditions for a subsequent heating process or for the pre-heating of the lower electrode. As shown in FIG. 9F, the capping layer 370 may then be removed and the exposed, pre-heated metal layer 360 identified as metal layer 362 in FIG. 9F, may be plasma-treated.

Figure 10A:
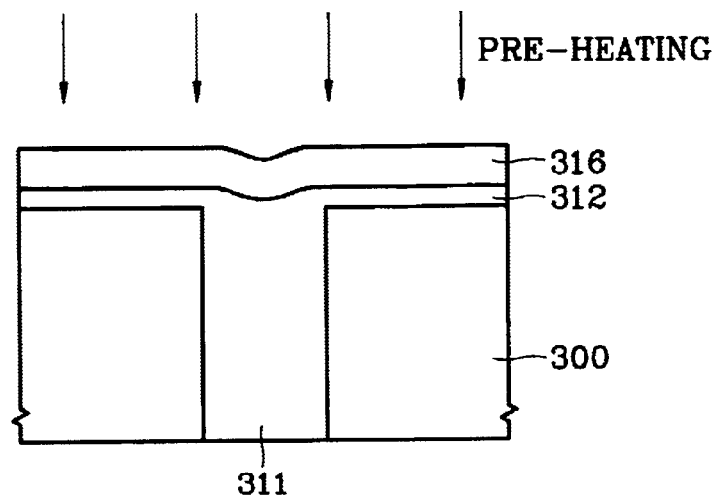
FIGS. 10A and 10B are schematic sectional views illustrating a contact plug manufactured according to embodiments of the present invention.
Figure 10B:
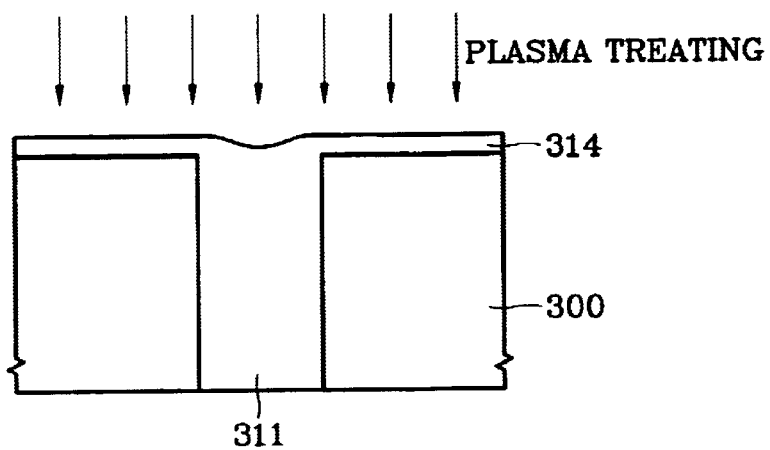

Operations for manufacturing a contact plug according to embodiments of the present invention will now be described with reference to FIGS. 10A and 10B. The contact plug may be, for example, the contact plug 310 of FIG. 9A. As shown in FIG. 10A, a contact hole 311 is formed in a semiconductor (integrated circuit) substrate or an interlevel dielectric (ILD) film 300. A metal layer 312 is formed on top of the integrated circuit substrate or the ILD film 300. In particular, the metal layer 312 fills the inside of the contact hole 311, substantially completely. In various embodiments of the present invention, the metal layer 312 is formed of at least one of ruthenium (Ru), iridium (Ir), platinum (Pt), rhodium (Rh), palladium (Pd), and metal oxides of Ru, Ir, Pt, Rh, and Pd. A capping layer 316 is formed on top of the metal layer 312, and the capped metal layer 312 is pre-heated. As shown in FIG. 10B, the capping layer 316 illustrated in FIG. 10A is removed, and the exposed, pre-heated metal layer 312, identified as metal layer 314 in FIG. 10B, is plasma-etched. It is to be understood that the metal layer 314 may be further processed, for example, by chemical mechanical polishing (CMP), until the top surface of the semiconductor substrate or the ILD film 300 is exposed, thereby providing a contact plug node.

As described above, grain growth on the surface of the lower electrode, the upper electrode, and/or the contact plug may be suppressed by pre-heating and/or plasma-treating, which may suppress variations in surface morphology. Thus, for example, in a capacitor, fine cracks may not occur in the dielectric layer interposed between the upper electrode and the lower electrode. In this manner the desireable characteristics of crystallization of the dielectric layer may be obtained while reducing the likelihood of increasing the leakage current of the capacitor. In addition, degradation of the adhesive strength of the layers resulting from variations in surface morphology may be reduced or prevented. This may help prevent the capacitor or contact plug from being stripped off of the insulating layer.

It should be noted that many variations and modifications can be made to the preferred embodiments described above without substantially departing from the principles of the present invention. All such variations and modifications are intended to be included herein within the scope of the present invention, as set forth in the following claims.

We claim:

1. A method for manufacturing a semiconductor device, the method comprising the steps of:
   forming a metal layer on a semiconductor substrate;
   forming a capping layer on top of the metal layer;
   pre-heating the metal layer after forming the capping layer;
   removing the capping layer; and
   accelerating charged particles to bombard the exposed metal layer after removing the capping layer.

2. The method as claimed in claim 1, after pre-heating the metal layer after forming the capping layer, further comprising the steps of forming an insulating layer on top of the metal layer, and heating the insulating layer.

3. The method as claimed in claim 1, wherein heating is performed in a $N_2$ atmosphere at a temperature of about 700° C.

4. The method as claimed in claim 2, wherein the insulating layer is heated in a $N_2$ atmosphere at a temperature of about 700° C.

5. The method as claimed in claim 4, wherein the capping layer is formed of an oxide layer.

6. The method as claimed in claim 1, wherein the metal layer is exposed to a plasma formed of at least one component of argon (Ar) and nitrogen (N) in the step accelerating charred particles to bombard the exposed metal layer after removing the capping layer.

7. The method as claimed in claim 1, wherein the metal layer is a lower electrode of a capacitor.

8. The method as claimed in claim 2, wherein the metal layer is a lower electrode of a capacitor, and the insulating layer is a dielectric layer of a capacitor.

9. The method as claimed in claim 1, wherein the metal layer is an upper electrode of a capacitor.

10. The method as claimed in claim 2, wherein the metal layer is an upper electrode of a capacitor, and the insulating layer is an interlevel dielectric (ILD) film.

11. The method as claimed in claim 1, wherein the metal layer is a contact plug for connecting the lower electrode of the capacitor to the semiconductor substrate or for connecting an upper interconnection to a lower interconnection of multilayer interconnections formed on the semiconductor substrate.

12. The method as claimed in claim 7, wherein the metal layer is formed of a material selected from the group consisting of ruthenium (Ru), iridium (Ir), platinum (Pt), rhodium (Rh), palladium (Pd), and metal oxide of Ru, Ir, Pt, Rh, and Pd.

13. The method as claimed in claim 8, wherein the dielectric layer is an oxide layer formed of at least one of tantalum (Ta), titanium (Ti), and aluminum (Al).

14. The method as claimed in claim 8, wherein the dielectric layer is formed of a material selected from the group consisting of $SrTiO_3$ (STO), $(Ba, Sr)TiO_3$ (BST), $PbTiO_3$, $Pb(Zr, Ti)O_3$ (PZT), $SrBi_2Ta_2O_5$ (SBT), $(Pb, La)(Zr, Ti)O_3$, $Bi_4Ti_3O_{12}$, and $BaTiO_3$ (BTO).

15. A method for manufacturing an integrated circuit device comprising:
   forming a metal layer on an integrated circuit substrate;
   forming a capping layer on the metal layer opposite the integrated circuit substrate;
   heat-treating the metal layer covered with the capping layer;
   removing the capping layer on at least a portion of the metal layer; and
   plasma-treating the metal layer which is exposed including accelerating charged particles to bombard the exposed metal layer.

16. The method of claim 15 further comprising:
   forming a dielectric layer on the plasma treated metal layer opposite the integrated circuit substrate; and
   heat-treating the dielectric layer.

17. The method of claim 16 wherein heat-treating the metal layer and heat-treating the dielectric layer are performed in an atmosphere comprising nitrogen at between about 500° C. and about 800° C.

18. The method of claim 17 wherein heat-treating the metal layer and heat-treating the formed dielectric layer are performed in an atmosphere comprising nitrogen at about 700° C.

19. The method of claim 17 wherein the metal layer substantially retains its surface morphology during heat-treating of the dielectric layer.

20. The method of claim 17 wherein the capping layer comprises an oxide layer.

21. The method of claim 16 wherein plasma-treating the metal layer which is exposed comprises exposing the metal layer to a plasma containing argon (Ar) and/or nitrogen ($N_2$).

22. The method of claim 15 wherein the integrated circuit device comprises an integrated circuit capacitor and wherein the metal layer comprises an electrode of the capacitor.

23. The method of claim 22 wherein the metal layer comprises at least one of ruthenium (Ru), iridium (Ir), platinum (Pt), rhodium (Rh), palladium (Pd), and metal oxides of Ru, Ir, Pt, Rh, and Pd.

24. The method of claim 16 wherein the integrated circuit device comprises an integrated circuit capacitor, wherein the metal layer comprises an electrode of the capacitor and wherein the dielectric layer comprises a dielectric layer of the capacitor.

25. The method of claim 24 wherein the metal layer comprises at least one of ruthenium (Ru), iridium (Ir), platinum (Pt), rhodium (Rh), palladium (ed), and metal oxides of Ru, Ir, Pt, Rh, and Pd and wherein the dielectric layer comprises an oxide layer formed of tantalum (Ta), titanium (Ti), and/or aluminum (Al).

26. The method of claim 24 wherein the dielectric layer comprise at least one of $SrTiO_3$ (STO), (Ba, Sr)$TiO_3$ (BST), $PbTiO_3$, Pb(Zr, Ti)$O_3$ (PZT), $SrBi_2Ta_2O_5$ (SBT), (Pb, La)(Zr, Ti)$O_3$, $Bi_4Ti_3O_{12}$, and $BaTiO_3$ (BTO).

* * * * *